United States Patent
Tsuji et al.

(10) Patent No.: US 6,903,607 B2
(45) Date of Patent: Jun. 7, 2005

(54) OPERATIONAL AMPLIFIER

(75) Inventors: Nobuaki Tsuji, Hamamatsu (JP);
Masao Noro, Hamamatsu (JP);
Kunihiko Mitsuoka, Iwata (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 10/623,826

(22) Filed: Jul. 21, 2003

(65) Prior Publication Data

US 2004/0017258 A1 Jan. 29, 2004

(30) Foreign Application Priority Data

Jul. 24, 2002 (JP) ..................................... P2002-215697

(51) Int. Cl.[7] ................................................. H03F 3/45
(52) U.S. Cl. ..................................... 330/253; 330/261
(58) Field of Search ................................ 330/252, 253, 330/261

(56) References Cited

U.S. PATENT DOCUMENTS 4,661,779 A * 4/1987 Okamoto .................... 330/253

6,292,056 B1 * 9/2001 Hallen ........................ 330/258
6,377,121 B1 * 4/2002 Giduturi ..................... 330/253

FOREIGN PATENT DOCUMENTS

JP 2001-053558 2/2001

* cited by examiner

Primary Examiner—Khanh V. Nguyen
(74) Attorney, Agent, or Firm—Pillsbury Winthrop Shaw Pittman LLP

(57) ABSTRACT

An operational amplifier has a differential amplifier stage comprising a pair of first PMOS transistors for inputting signals, which are arranged between a positive voltage supply coupled with a first constant current source and a negative voltage supply, wherein second PMOS transistors of a high voltage resistant type, gates of which are biased to a prescribed voltage, are arranged on current paths lying between the first PMOS transistors and the negative voltage supply together with load resistors. Herein, each of drain voltages of the first PMOS transistors is limited to a certain value that is higher than the prescribed voltage by a gate threshold voltage. Therefore, even when the first PMOS transistors are configured of a normal voltage resistant type, it is possible to reliably prevent voltages applied to the first PMOS transistors from exceeding breakdown voltages thereof, thus avoiding unnecessary reduction of an S/N ratio.

6 Claims, 4 Drawing Sheets

OPERATIONAL AMPLIFIER

BACKGROUND OF THE INVENTION

1. Field of the Invention

This invention relates to operational amplifiers that operate based on relatively high supply voltages applied thereto.

2. Description of the Related Art

FIGS. 4A and 4B show conventional examples of operational amplifiers that operate based on relatively high supply voltages applied thereto. The operational amplifier of FIG. 4A is constituted by a constant current source IS, P-channel Metal-Oxide Semiconductor (PMOS) transistors P1 and P2 for receiving input signals, and N-channel Metal-Oxide Semiconductor (NMOS) transistors N1 and N2 acting as loads of circuitry, wherein a positive supply voltage of 9 V and a negative supply voltage of −9 V are applied to the circuitry. An input signal IP is supplied to a gate of the PMOS transistor P1 via a noninverting input terminal (not shown), while an input signal IN is supplied to a gate of the PMOS transistor P2 via an inverting input terminal (not shown). Compared with the operational amplifier of FIG. 4A, the operational amplifier of FIG. 4B is constituted using resistors r1 and r2, which are substituted for the aforementioned NMOS transistors N1 and N2.

If the input signals IP and IN do not have the same phase, it is possible for the source-drain voltage and the gate-drain voltage of the PMOS transistors P1 and P2 to exceed the prescribed voltage of 7 V; therefore, when transistors of a normal voltage resistant type are used for the PMOS transistors P1 and P2 in the operational amplifiers of FIGS. 4A and 4B, these devices may be destroyed. For this reason, in order to actualize operational amplifiers of a high supply voltage type, it is necessary to use MOS transistors of a high voltage resistant type.

In general, MOS transistors of a high voltage resistant type have a relatively low mutual conductance gm, and they also provide a relatively high gate threshold voltage. This causes a relatively great dispersion in characteristics of MOS transistors. For this reason, when transistors of a high voltage resistant type are used for the PMOS transistors P1 and P2 used in the aforementioned operational amplifiers shown in FIGS. 4A and 4B, it becomes difficult to produce relatively high gains, which are basic characteristics of operational amplifiers. That is, due to unwanted offsets, operational amplifiers must have reduced S/N ratios.

SUMMARY OF THE INVENTION

It is an object of the invention to provide an operational amplifier of a high supply voltage type that can prevent the S/N ratio from being unnecessarily reduced.

An operational amplifier of this invention has a differential amplifier stage comprising a pair of first PMOS transistors for inputting signals, which are arranged between a positive voltage supply coupled with a first constant current source and a negative voltage supply, in which second PMOS transistors of a high voltage resistant type having gates biased to a prescribed voltage are arranged on current paths lying between the first PMOS transistors and the negative voltage supply together with load resistors. Herein, each of the drain voltages of the first PMOS transistors is limited to a certain value that is produced by adding a gate threshold voltage to the prescribed voltage. Therefore, even when each of the first PMOS transistors is a normal voltage resistant type, it is possible to reliably prevent voltages applied to the first PMOS transistors from exceeding breakdown voltages thereof. Thus, it is possible to prevent the S/N ratio of the operational amplifier from being unnecessarily reduced even when the supply voltage is increased.

In the above, there is also arranged a bias circuit for biasing the gates of the second PMOS transistors, which comprises third and fourth PMOS transistors coupled together, and a second constant current source laid in proximity to the negative voltage supply. This reliably prevents drain voltages of the first MOS transistors from being reduced to be lower than the aforementioned value that is higher than the prescribed voltage by the gate threshold voltage. That is, source-drain voltages of the first MOS transistors can be approximately limited within the gate threshold voltages thereof.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENTS

This invention will be described in further detail by way of examples with reference to the accompanying drawings.

Figure 1:
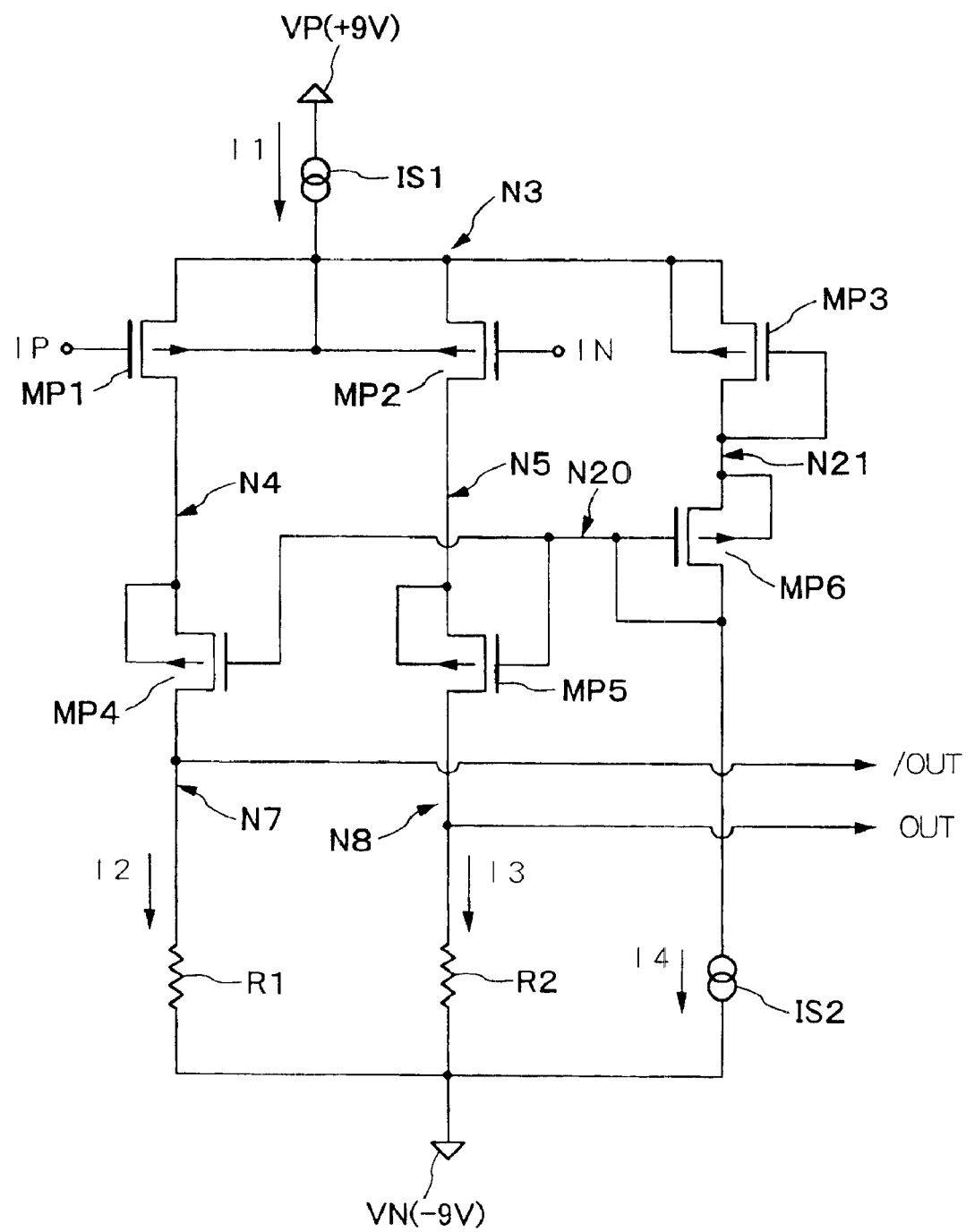
FIG. 1 is a circuit diagram showing the configuration of a differential amplifier stage of an operational amplifier in accordance with a preferred embodiment of the invention.

An operational amplifier of a preferred embodiment of the invention comprises a differential amplifier stage that performs amplification in response to differences between input signals (e.g., input signals of positive and negative phases, or input signals of normal and reverse phases) supplied thereto via a noninverting input terminal and an inverting input terminal respectively, in which FIG. 1 shows a configuration of the differential amplifier stage. In FIG. 1, a constant current source IS1 (namely, a first constant current source) functions as a current limiter that limits a current I1 flowing thereto from a positive voltage supply VP (namely, a first voltage supply) within a prescribed range. Sources of a pair of PMOS transistors MP1 and MP2 (namely, first MOS transistors) are commonly connected with the positive voltage supply VP via the constant current source IS1. A positive-phase input signal (or a normal-phase input signal) IP is supplied to a gate of the PMOS transistor MP1 via a noninverting input terminal (not shown), while a negative-phase input signal (or a reverse-phase input signal) IN is supplied to a gate of the PMOS transistor MP2 via an inverting input terminal. The PMOS transistors MP1 and MP2 are of a normal voltage resistant type, in which substrates (or wells) are commonly connected with sources.

A pair of PMOS transistors MP4 and MP5 (namely, second MOS transistors), conduction types (i.e., channel types) which are identical to those of the PMOS transistors MP1 and MP2, are arranged on current paths lying between drains of the PMOS transistors MP1 and MP2 and a negative voltage supply VN (namely, a second voltage supply). In addition, resistors R1 and R2, which act as load circuits, are arranged on current paths lying between drains of the PMOS transistors MP4 and MP5 and the negative voltage supply VN. Specifically, sources of the PMOS transistors MP4 and MP5 of a high voltage resistant type are respectively connected with the drains of the PMOS transistors MP1 and MP2; and the drains of the PMOS transistors MP4 and MP5 are connected with the negative voltage supply VN via the resistors R1 and R2 respectively. Furthermore, a prescribed voltage produced by a bias circuit, details of which will be described later, is applied to gates of the PMOS transistors MP4 and MP5.

The aforementioned bias circuit for biasing gates of the PMOS transistors MP4 and MP5 at a prescribed voltage is constituted by a PMOS transistor MP3 (namely, a third MOS transistor), a PMOS transistor MP6 (namely, a fourth MOS transistor), and a constant current source IS2. Specifically, the PMOS transistor MP3 is of a normal voltage resistant type, wherein a source thereof is connected with the positive voltage supply VP via the constant current source IS1. A drain of the PMOS transistor MP3 is connected to a source of the PMOS transistor MP6 of a high voltage resistant type in which a gate and a drain are commonly connected with the gates of the PMOS transistors MP4 and MP5. In addition, the constant current source IS2 (namely, a second constant current source) is arranged between the drain of the PMOS transistor MP6 and the negative voltage supply VN in order to limit a current I4 flowing towards the negative voltage supply VN to a prescribed value.

In the present embodiment, the PMOS transistors MP1, MP2, and MP3 of a normal voltage resistant type are all set to have the same gate threshold voltage Vt, i.e., 0.8 V, while the PMOS transistors MP4, MP5, and MP6 of a high voltage resistant type are all set to have the same gate threshold voltage Vth, i.e., 1.5 V. In addition, the current I1 flowing through the constant current source IS1 is set to 110 $\mu$A, while the current I4 flowing through the constant current source IS2 is set to 10 $\mu$A. Characteristics of the PMOS transistors MP1, MP2, MP4, and MP5 are each set in such a way that when a current of 50 $\mu$A flows therethrough, a gate voltage against a source voltage becomes approximately identical to the prescribed gate threshold voltage. Characteristics of the PMOS transistors MP3 and MP6 are each set in such a way that when a drain current of 10 $\mu$A flows therethrough, a gate voltage against a source voltage becomes approximately identical to the prescribed gate threshold voltage. In short, values of the constant current sources IS1 and IS2 are respectively set such that gate voltages against source voltages become approximately identical to prescribed gate threshold voltages of MOS transistors.

Next, the overall operation of the operational amplifier of the present embodiment having the differential amplifier stage of FIG. 1 will be described in detail, in which input signals IP and IN are both set to have the same phase (or they are set to have phases, differences of which are very small), and in which they are set to levels that are lower than the positive supply voltage (VP) by the gate threshold voltage Vt of the PMOS transistors MP1 and MP2.

Due to the provision of the constant current source IS2, both drain currents of the PMOS transistors MP3 and MP6 are set to 10 $\mu$A, so that the gate voltage of the PMOS transistor MP3 (corresponding to a potential of a node N21) is reduced by the gate threshold voltage Vt (e.g., 0.8V) compared with the source voltage thereof (corresponding to a potential of a node N3). In addition, the gate voltage of the PMOS transistor MP6 (corresponding to a potential of a node N20) is reduced by the gate threshold voltage Vth (e.g., 1.5V) compared with the drain voltage of the PMOS transistor MP3 (corresponding to a potential of a node N21). Therefore, both gates of the PMOS transistors MP4 and MP5 are set to a certain voltage that is lower than the positive supply voltage VP by 'Vt+Vth'.

The aforementioned input signals IP and IN are respectively supplied to the gates of the PMOS transistors MP1 and MP2, which operate in weak current regions so as to act as loads against the PMOS transistors MP4 and MP5 respectively. Herein, drain voltages of the PMOS transistors MP1 and MP2 (corresponding to potentials of nodes N4 and N5 respectively) are relatively high in an initial state. When they are decreased to voltages, both of which are higher than a prescribed voltage by the gate threshold voltage Vth, both the PMOS transistors MP4 and MP5 are turned off. Thereafter, the drain voltages of the PMOS transistors MP1 and MP2 (corresponding to the potentials of the nodes N4 and N5) are each stabilized at a certain voltage that is higher than a prescribed voltage by the gate threshold voltage Vth of the PMOS transistors MP4 and MP5. At this time, drain voltages of the PMOS transistors MP4 and MP5 (corresponding to potentials of nodes N7 and N8 respectively) are applied to the resistors R1 and R2 respectively. The resistors R1 and R2 cause the drain voltages of the PMOS transistors MP4 and MP5 to decrease to the negative supply voltage VN in response to differences between the input signals IP and IN, thus producing output signals/OUT and OUT.

Figure 2:
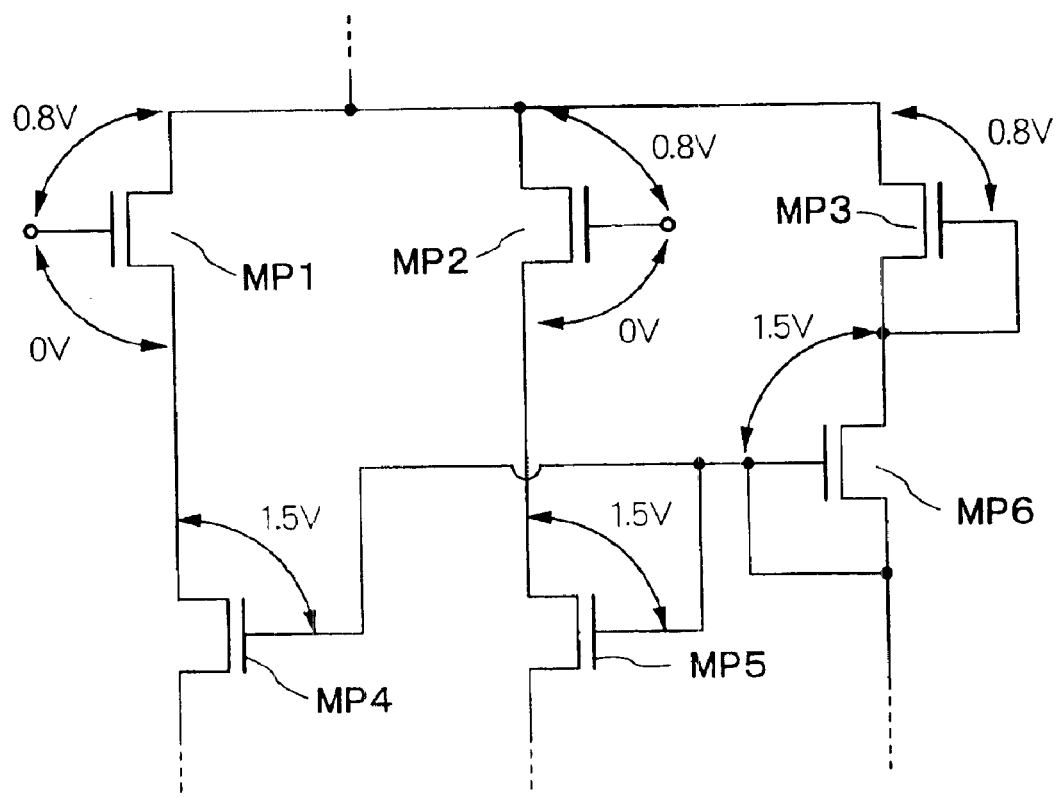
FIG. 2 is a circuit diagram showing mutual relationships between MOS transistors with respect to gate threshold voltages set thereto.

Next, biased states of the aforementioned PMOS transistors will be described with reference to FIG. 2. In the aforementioned operation, both of a source-gate voltage and a source-drain voltage of the PMOS transistor MP3 of a normal voltage resistant type are maintained at the gate threshold voltage Vt (e.g., 0.8V). A source-gate voltage of the PMOS transistor MP6 is set to the gate threshold voltage Vth (e.g., 1.5V), and both of source-gate voltages of the PMOS transistors MP4 and MP5 are set to the gate threshold voltage Vth (e.g., 1.5V). In addition, both of source-gate voltages of the PMOS transistors MP1 and MP2 are set to the gate threshold voltage Vt, while both of gate-drain voltages thereof are approximately set to 0V.

In the above, the drain voltages of the PMOS transistors MP1 and MP2 may be actually varied in response to the input signals IP and IN, which are applied thereto as differential signals, in which lower-limit values thereof are set to prescribed values that are produced by adding the gate threshold voltage Vt to the same gate voltage of the PMOS transistors MP4 and MP5 (i.e., the aforementioned prescribed voltage produced by the bias circuit). Therefore, even when the supply voltage is further increased, it is possible to assure stable operations of the PMOS transistor MP1 and MP2 in response to the input signals IP and IN while certainly reducing voltages between sources, drains, and gates of the PMOS transistors MP1, MP2, and MP3 (each constituted as of a normal voltage resistant type) to be lower than breakdown voltages thereof.

Differences between the input signals IP and IN cause differences between operational states of the PMOS transistors MP1 and MP2, which in turn cause imbalances between currents I2 and I3 flowing through the resistors R1 and R2, thus producing amplified complementary signals as the output signals/OUT and OUT. The performance regarding differential amplification is dominated by operations of the PMOS transistors MP1 and MP2 having relatively small dispersions in characteristics. For this reason, compared with the circuitry using MOS transistors of a high voltage resistant type, it is possible to reduce an offset and to produce a high gain, thus securing a relatively high S/N ratio.

Next, applications of an operational amplifier 100 having the aforementioned differential amplifier stage will be described with reference to FIGS. 3A and 3B.

Figure 3A:
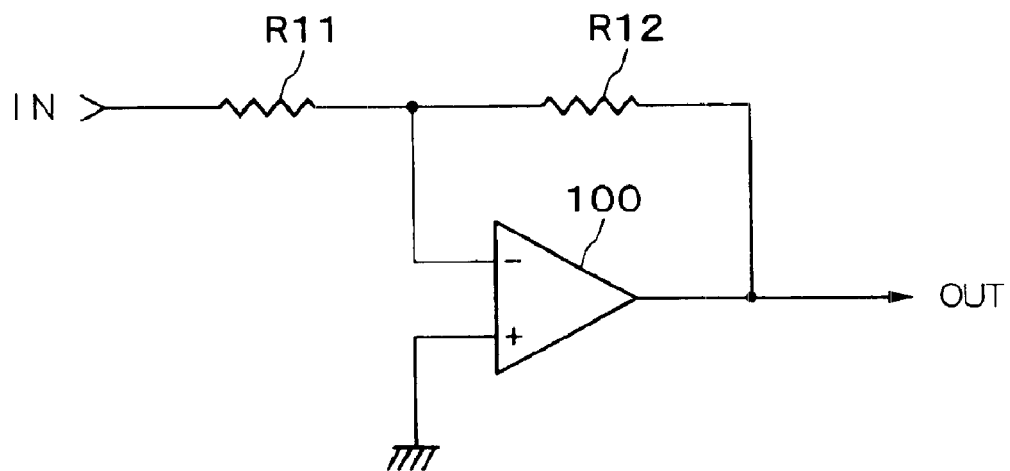
FIG. 3A is a simplified circuit diagram showing an inverting amplifier using an operational amplifier having the differential amplifier stage shown in FIG. 1.
Figure 3B:
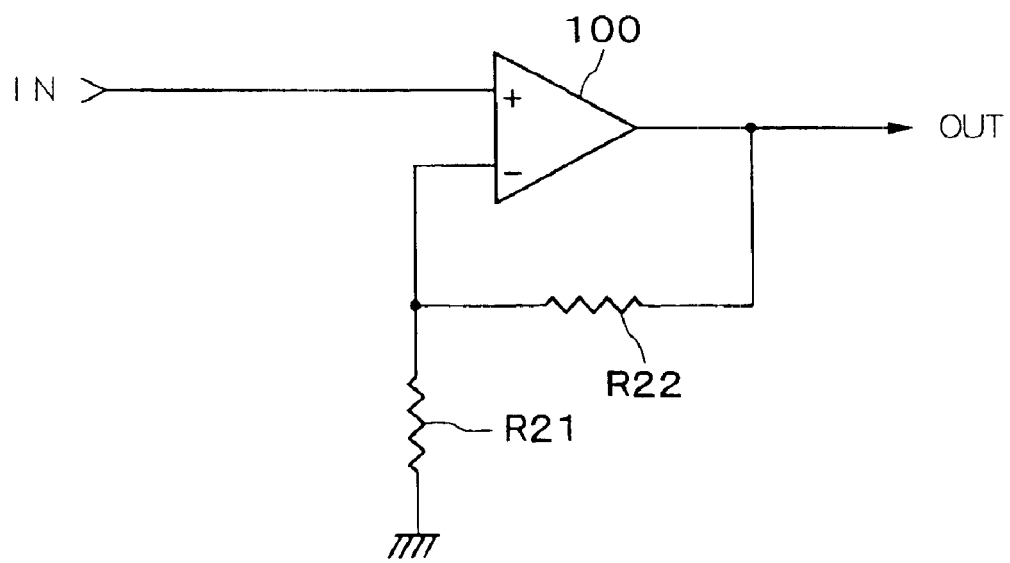
FIG. 3B is a simplified circuit diagram showing a non-inverting amplifier using an operational amplifier having the differential amplifier stage shown in FIG. 1.
Figure 4A:
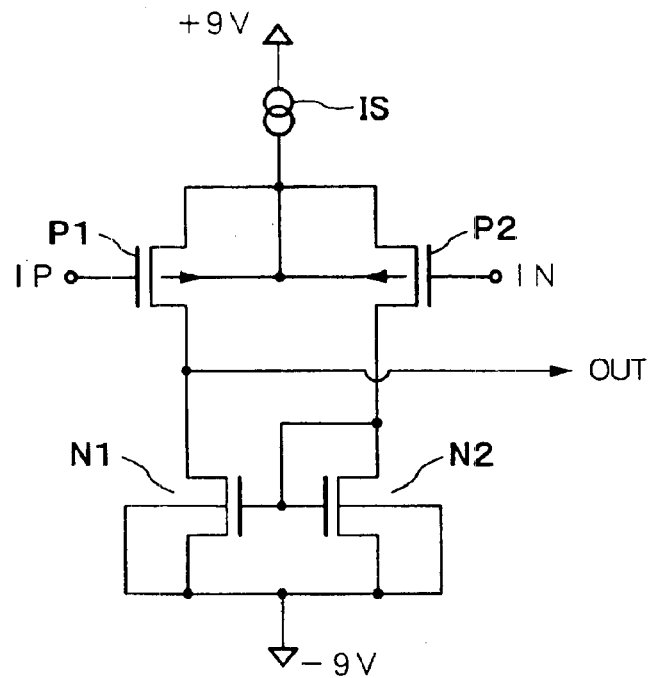
FIG. 4A is a circuit diagram showing an example of an operational amplifier that is conventionally known.
Figure 4B:
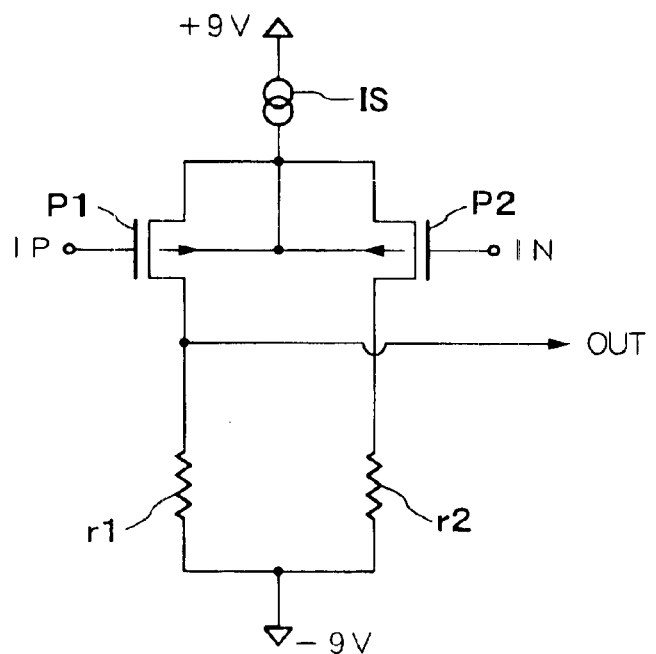
FIG. 4B is a circuit diagram showing an example of an operational amplifier that is conventionally known.

FIG. 3A shows an example of an inverting amplifier in which a noninverting input terminal of the operational amplifier 100 is grounded, while an inverting input terminal receives an input signal IN via a resistor R11. In addition, a negative-feedback resistor R12 is connected between the inverting input terminal and an output terminal of the operational amplifier 100. FIG. 3B shows an example of a noninverting amplifier (or a common-mode amplifier) in which an input signal IN is directly applied to a noninverting input terminal of the operational amplifier 100, an inverting input terminal of which is grounded via a resistor R21. In addition, a negative-feedback resistor R22 is connected between the inverting input terminal and an output terminal of the operational amplifier 100. These applications satisfy prescribed conditions regarding virtual short-circuit (or virtual earth), wherein signals of the same phase are applied to the inverting input terminal and noninverting input terminal. By supplying input signals of the same phase to the operational amplifier, it is possible to reliably stabilize operations of MOS transistors so as not to exceed breakdown voltages thereof.

This invention is not necessarily limited to the present embodiment; hence, it is possible to modify the present embodiment without departing from the scope of the invention. For example, the present embodiment uses resistors as load circuits; instead, it is possible to use current mirror circuits. In addition, the differential amplifier stage of the operational amplifier shown in FIG. 1 is constituted using PMOS transistors, which can be replaced with NMOS transistors and the like.

Lastly, this invention has a variety of effects and technical features, which will be described below.

(1) An operational amplifier of this invention comprises a differential amplifier stage that performs differential amplification on differences between input signals respectively applied to a pair of a noninverting input terminal and an inverting input terminal, wherein the differential amplifier stage comprises a pair of first MOS transistors for inputting signals, and a pair of second MOS transistors of a high voltage resistant type, gates of which are both biased in potential. Specifically, sources of the first MOS transistors are commonly connected with a first voltage supply via a first constant current source for use in current limitation, while drains of the first MOS transistors are connected with sources of the second MOS transistors, drains of which are further connected with a second voltage supply via load resistors respectively. Herein, when the first MOS transistor is turned off so that the drain voltage thereof is reduced to be lower than a certain voltage that is greater than the gate voltage of the second MOS transistor by a gate threshold voltage, the second MOS transistor is turned off; thus, the source-drain voltage of the first MOS transistor can be maintained constant. That is, by adequately controlling the gate voltage of the second MOS transistor, it is possible to prevent the source-drain voltage of the first MOS transistor from exceeding a prescribed breakdown voltage even when the supply voltage applied to the operational amplifier is increased. This allows MOS transistors of a normal voltage resistant type to be used for the first MOS transistors, whereby it is possible to prevent an S/N ratio from being unnecessarily reduced.

(2) In the above, it is possible to additionally arrange third and fourth MOS transistors and a second constant current source. Herein, a source of the third MOS transistor whose gate and drain are coupled together is connected with the first voltage supply via the first constant current source, and the drain thereof is connected with a source of the fourth MOS transistor whose gate and drain are coupled together. The drain of the fourth MOS transistor is connected with the second voltage supply via the second constant current source. In addition, the gate and drain of the fourth MOS transistor are commonly connected with gates of the second MOS transistors. By adequately selecting a current value of the second current source and electric characteristics of the third and fourth MOS transistors, it is possible to adjust the gate voltage applied to the second MOS transistors. For example, the first and third MOS transistors are configured of a normal voltage resistant type having a lower gate threshold voltage (Vt), while the second and fourth MOS transistors are configured of a high voltage resistant type having a higher gate threshold voltage (Vth). Herein, the source-drain voltage of the first MOS transistor is approximately limited within the gate threshold voltage thereof, similarly to the third MOS transistor. Thus, it is possible to secure a relatively high S/N ratio even when a relatively high supply voltage is applied to the operational amplifier.

(3) The aforementioned first voltage supply produces a positive voltage, and the second voltage supply produces a negative voltage, wherein the first to fourth MOS transistors are configured by P-channel MOS transistors, for example. In this case, it is possible to operate the differential amplifier stage with a relatively high gain as long as input signals are each controlled in level to be lower than the first supply voltage by the gate threshold voltage.

As this invention may be embodied in several forms without departing from the spirit or essential characteristics thereof, the present embodiment is therefore illustrative and not restrictive, since the scope of the invention is defined by the appended claims rather than by the description preceding them, and all changes that fall within metes and bounds of the-claims, or equivalents of such metes and bounds are therefore intended to be embraced by the claims.

What is claimed is:

1. An operational amplifier having a differential amplifier stage for performing amplification in response to a difference between a pair of input signals input thereto via a noninverting input terminal and an inverting input terminal respectively, wherein said differential amplifier stage includes a first constant current source for use in current limitation, said operational amplifier comprising:

a pair of first MOS transistors, sources of which are commonly connected with a first voltage supply via the first constant current source, and gates of which receive the pair of input signals respectively;

a pair of second MOS transistors of a high voltage resistant type having a same conduction type that is identical to a conduction type of the pair of first MOS transistors, wherein the second MOS transistors are respectively arranged on current paths between drains of the first MOS transistors and a second voltage supply;

a pair of load circuits that are arranged on current paths between drains of the second MOS transistors and the second voltage supply; and a bias circuit for biasing gates of the second MOS transistors at a prescribed voltage, wherein the bias circuit includes a third MOS transistor in which a source is connected with the first voltage supply via the first constant current source and in which a gate and a source are connected together, a fourth MOS transistor of a high voltage resistant type in which a source is connected with the drain of the third MOS transistor and in which a gate and a drain are commonly connected with the gates of the second MOS transistors, and a second constant current source that is connected between the drain of the fourth MOS transistor and the second voltage supply.

2. An operational amplifier according to claim 1, wherein current values of the first and second constant current sources are set such that a source-gate voltage of each of the second to fourth MOS transistors is substantially identical to a prescribed gate threshold voltage.

3. An operational amplifier according to claim 1, wherein the first voltage supply produces a positive voltage while the second voltage supply produces a negative voltage, and wherein the first to fourth MOS transistors are all configured as P-channel MOS transistors.

4. An operational amplifier according to claim 2, wherein the first voltage supply produces a positive voltage while the second voltage supply produces a negative voltage, and wherein the first to fourth MOS transistors are all configured as P-channel MOS transistors.

5. An operational amplifier according to claim 1, wherein a first gate threshold voltage is set to the pair of first MOS transistors, and a second gate threshold voltage that is higher than the first gate threshold voltage is set to the pair of second MOS transistors.

6. An operational amplifier according to claim 1, wherein a first gate threshold voltage is set to the pair of first MOS transistors and the third MOS transistor respectively, and a second gate threshold voltage that is higher than the first gate threshold voltage is set to the pair of second MOS transistors and the fourth MOS transistor respectively.

* * * * *